US006170433B1

(12) United States Patent
Du Bois

(10) Patent No.: US 6,170,433 B1
(45) Date of Patent: Jan. 9, 2001

(54) METHOD AND APPARATUS FOR PROCESSING A WAFER

(75) Inventor: Dale R. Du Bois, Los Gatos, CA (US)

(73) Assignee: Applied Materials, Inc., Santa Clara, CA (US)

(*) Notice: Under 35 U.S.C. 154(b), the term of this patent shall be extended for 0 days.

(21) Appl. No.: 09/121,799

(22) Filed: Jul. 23, 1998

(51) Int. Cl.[7] .................................................. C23C 16/00
(52) U.S. Cl. ........................ 118/725; 118/728; 118/729; 118/730
(58) Field of Search ................................... 118/725, 728, 118/729, 730

(56) References Cited

U.S. PATENT DOCUMENTS

| 5,370,739 | * | 12/1994 | Foster | ..................................... 118/728 |
| 5,375,291 | | 12/1994 | Tateyama et al. . | |
| 5,527,393 | * | 6/1996 | Sato | ..................................... 118/728 |
| 5,879,576 | | 3/1999 | Wada et al. . | |

FOREIGN PATENT DOCUMENTS

| 2 646 861 | 5/1989 | (EP) . |
| 0 766 289 A2 | 9/1996 | (EP) . |
| 10057877 | 5/1997 | (EP) . |
| 0 592 017 A2 | 3/1998 | (EP) . |

OTHER PUBLICATIONS

Copy of International PCT Search Report PCT/US 99/16555.

* cited by examiner

Primary Examiner—Richard Bueker
(74) Attorney, Agent, or Firm—Blakely Sokoloff Taylor & Zafman

(57) ABSTRACT

A semiconductor processing system includes a processing chamber, a rotatable shaft extending into the chamber, and a wafer holder in the chamber. The rotatable shaft has a gas flow passage therethrough. The wafer holder is capable of supporting a wafer in position in the chamber so that the processing gas flow passage directs flow onto a face of the wafer.

7 Claims, 3 Drawing Sheets

METHOD AND APPARATUS FOR PROCESSING A WAFER

BACKGROUND OF THE INVENTION

1). Field of the Invention

The present invention relates generally to a semiconductor processing system and, more particularly, to a semiconductor processing system which compensates for depletion of processing gases over a wafer being processed.

2). Discussion of Related Art

Semiconductor devices are manufactured by exposing a silicon wafer to respective processing steps such as the deposition of a layer on the wafer or etching of a layer on the wafer. The wafer is inserted into a semiconductor processing chamber and heated to a temperature sufficient for purposes of processing. Gases are then introduced into the chamber which react with one another or with the wafer to process the wafer. One of the amorphous or polysilicon processing steps carried out on the wafer is the formation of an epitaxial silicon layer on the wafer. Certain benefits, such as proper sealing of the wafer, can be achieved by depositing the amorphous or polysilicon layer on opposing faces of the wafer.

The wafer is supported by means of small seats contacting a lower face of the wafer. By so supporting the wafer the lower face of the wafer can be exposed to the processing gases.

It may in certain instances be required to locate a heat plate below the wafer. A heat lamp may be located to radiate onto the heat plate so that the heat plate is heated. The heat plate, in turn, is used to heat the lower face of the wafer. The processing gases may then flow into a space between the heat plate and the wafer for purposes of processing the lower face of the wafer.

One problem associated with such a wafer-and-heat plate configuration is that the dimensions of the space is such that insufficient processing gases flow through the space between the wafer and the heat plate. The processing gases tend to deplete near an edge of the wafer leaving a central portion of the wafer insufficiently processed. Stated differently, depletion of the processing gas results in more processing tending to occur on the lower face of the wafer near an edge of the wafer than in the central portion of the wafer.

SUMMARY OF THE INVENTION

A semiconductor processing system is disclosed. In accordance with one embodiment, the semiconductor processing system includes a processing chamber having a wafer holder that is connected to a rotatable shaft. The rotatable shaft has a gas flow passage therethrough. During processing, the wafer holder supports a wafer within the chamber so that the processing gas flow passage directs a gas flow onto a face of the wafer.

BRIEF DESCRIPTION OF THE DRAWINGS

The invention is further described by way of example with reference to the accompanying drawings wherein.

DETAILED DESCRIPTION OF THE INVENTION

A semiconductor processing system and a method of processing a wafer are described. In the following description, numerous specific details are set forth in order to provide a thorough understanding of the present invention. However, it will be obvious to one of skill in the art that the invention may be practiced without these specific details. In other instances, well known elements and processing techniques have not been shown in particular detail in order to avoid unnecessarily obscuring the present invention.

In accordance with one embodiment of the present invention, a wafer holder, located within a semiconductor processing chamber, is connected to a rotatable shaft having a gas flow passage extending longitudinally therethrough. During processing, gas is directed onto a face of a wafer through the shaft gas flow passage.

Figure 1:
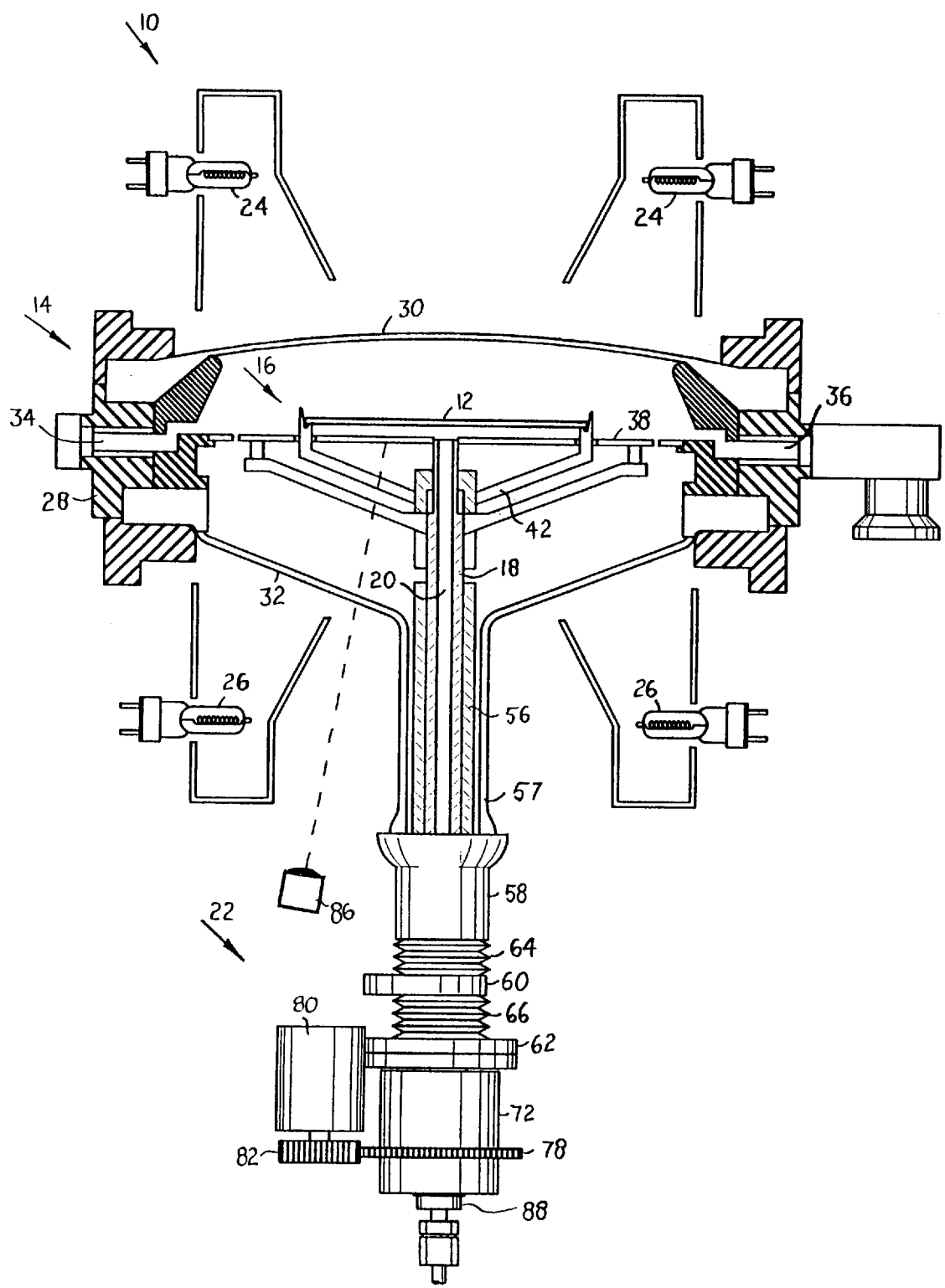
FIG. 1 is a partially sectioned side view of a semiconductor processing system according to the invention.

FIG. 1 of the accompanying drawings illustrates a semiconductor processing system 10, in one embodiment of the invention, which is used for processing a wafer 12 according to chemical vapor deposition principles. The system 10 includes a semiconductor processing chamber 14, a wafer support assembly 16 located within the chamber 14, a rotatable shaft 18 extending into the semiconductor processing chamber 14 having a processing gas flow passage 20 longitudinally formed therethrough, and an assembly 22 below the semiconductor processing chamber 14 which is used for imparting movement to the wafer support assembly 16 with the shaft 18. A circular array of infrared heat lamps 24 is located above the chamber 14, and a circular array of infrared heat lamps 26 is located below the chamber 14.

The chamber 14 is constructed of a stainless steel base ring 28, an upper quartz window 30 which seals circumferentially with an upper edge of the base ring 28, and a lower quartz window 32 which seals circumferentially with a lower edge of the base ring 28. A processing gas inlet port 34 is formed through the base ring 28 into the chamber 14 and a processing gas outlet port 36 is formed through the base ring 28 out of the chamber 14.

Figure 2:
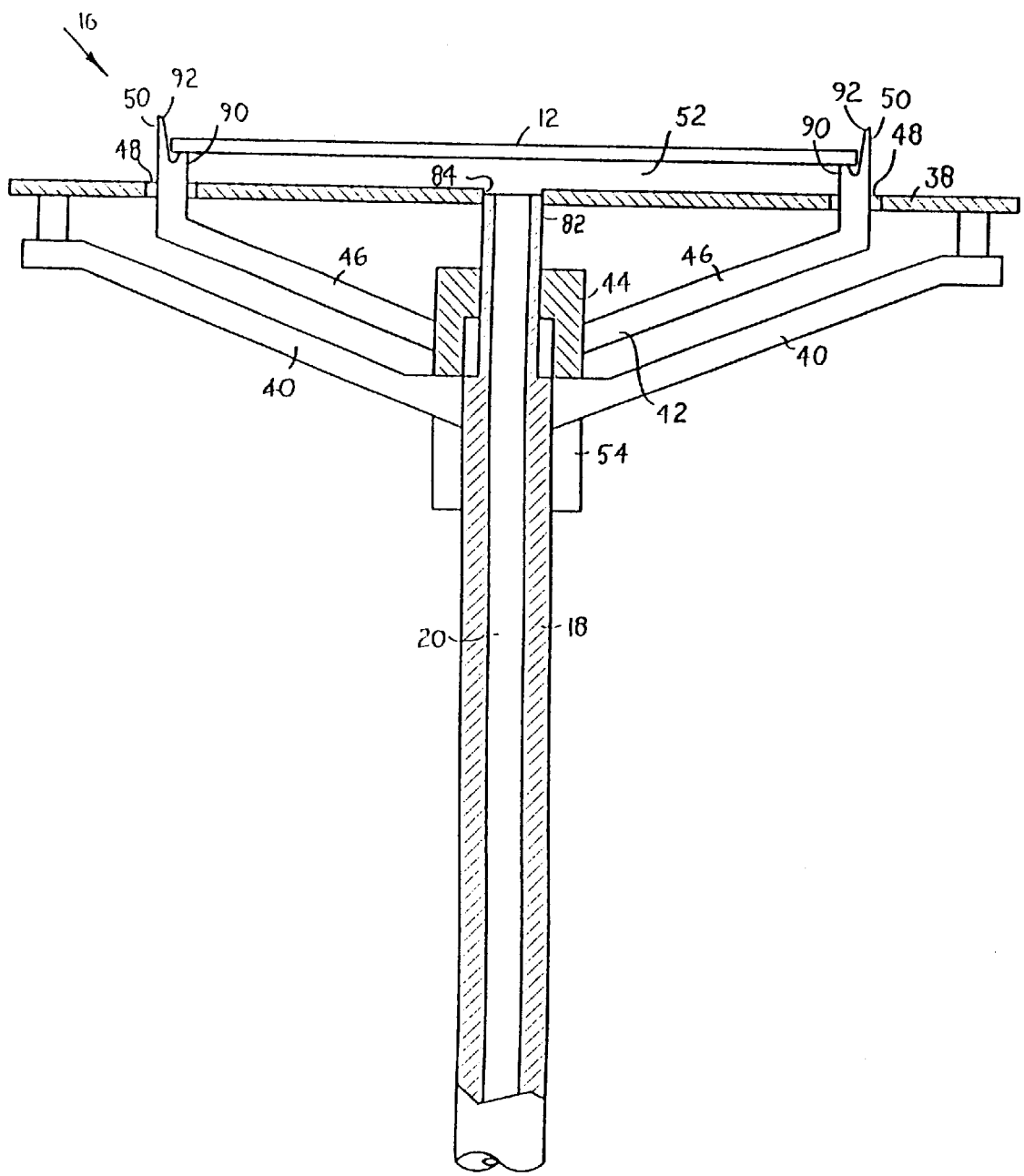
FIG. 2 is a sectioned side view of a wafer support assembly which is located within a semiconductor processing chamber forming part of the system of FIG. 1.

As shown in FIG. 2, the wafer support assembly 16 includes a wafer support structure 42 and a heat plate 38 which is secured in a horizontal position to the shaft 18 by means of arms 40 connecting the heat plate 38 to the shaft 18. The support structure 42 includes a sleeve 44 around the shaft 18, and arms 46 extending outwardly from the sleeve 44 and through openings 48 in the heat plate 38. The arms 46 terminate in small seats 50 which support the wafer 12 in a horizontal position so that a space 52 is defined between a lower face of the wafer 12 and an upper surface of the heat plate 38.

The sleeve 44 is formed with a number of slots 54 through which the arms 40 extend. The slots 54 in the sleeve 44 are rotatably engaged with the arms 40 so that the support structure 42 and the wafer 12 rotate in unison together with the shaft 18. The slots 54 allow for axial movement of the sleeve between a position wherein the sleeve rests on the arms 40 and a position wherein the sleeve 44 is elevated so as to elevate the seats 50 and the wafer 12 relatively to the heat plate 38.

Referring again to FIG. 1, the heat lamps 24 are positioned to radiate infrared light through the upper window 30 onto an upper face of the wafer 12 and the heat lamps 26 are positioned to radiate infrared light through the lower window 32 onto a lower surface of the heat plate 38.

A cylinder 56 is located around the shaft 18 and is axially movable relative to the shaft 18. Both the cylinder 56 and the shaft 18 extend through a tubular opening 57 in the lower window 32.

Figure 3:
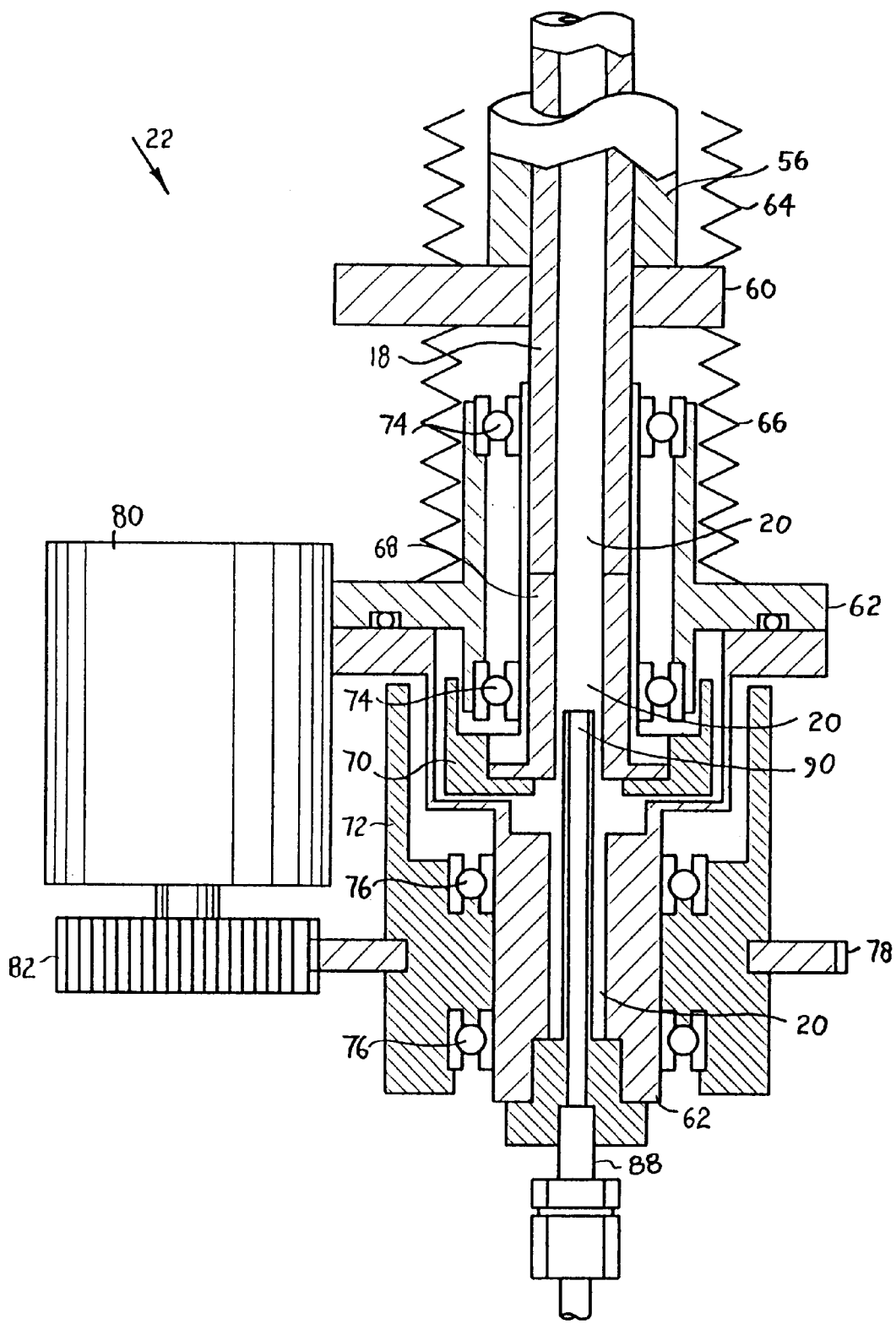
FIG. 3 is a sectioned side view of an assembly which is used for imparting movement to the wafer support assembly of FIG. 2.

Assembly 22, located below the semiconductor processing chamber 14, operates to rotate the shaft 20 and to cause translational movement of the shaft 20 and the cylinder 56. Assembly 22 includes non-rotating and rotating components, details of which are discussed hereinbelow. With reference to FIGS. 1 and 3, the non-rotating components include an upper ring 58 which seals circumferentially with the tubular opening 57 in the lower window 32, a cylinder actuator ring 60 below the upper ring 58, and a lower cup 62 below the cylinder actuator ring 60. A bellows 64 between the upper ring 58 and the cylinder actuator ring 60 allows for movement of the cylinder actuator ring 60 relative to the upper ring 58. A bellows 66 between the cylinder actuator ring 60 and the lower cup 62 allows for movement of the lower cup 62 relative to the cylinder actuator ring 60.

Referring in particular to FIG. 3, the rotating components include the shaft 18 which extends downwardly through the upper ring 58 and the cylinder actuator ring 60 into the lower cup 62, a Teflon® seat 68 within the lower cup 62, a first magnet 70 which is engaged with the seat 68, and a second magnet 72 around the lower cup 62. The shaft 18, the seat 68 and the first magnet 70 are rotatably mounted to the lower cup 62 by means of internal bearings 74. The second magnet 72 is rotatably mounted to the lower cup 62 by means of external bearings 76.

A gear 78 surrounds and is engaged with the second magnet 72. A motor 80 is mounted to the lower cup 62 and drives a pinion 82 which is in mesh with the gear 78. Rotation of the pinion 82 by the motor 80 causes rotation of the gear 78 and the second magnet 72. The second magnet 72 induces rotation of the first magnet 70 through the lower cup 62. Rotation of the first magnet 70 causes rotation of the seat 68 and the shaft 18. Rotation of the shaft 18, as previously mentioned, causes rotation of the heat plate 38 and the wafer 12.

Movement of the lower cup 62 along an axis of the shaft 18 is allowed for by compression and expansion of the bellows 66. Such axial movement of the lower cup 62 causes axial movement of the shaft 18, resulting in a change in elevation of the heat plate 38.

The cylinder 56 rests on the cylinder actuator ring 60. Movement of the cylinder actuator ring 60 in an axial direction of the cylinder 56 is allowed for by compression and expansion of the bellows 64. Such axial movement of the cylinder actuator ring 60 causes engagement and disengagement of the cylinder 56 with the sleeve 44 of the wafer support structure 42. Further axial movement of the cylinder actuator ring 60 results in a change in elevation of the wafer 12.

By so changing the elevation of the wafer 12 and of the heat plate 38, the space between the wafer 12 and the heat plate 38 can be adjusted, and the wafer 12 and the heat plate 38 can be lowered for purposes of inserting a wafer carrying blade through a slot (not shown) in the base ring 28 of the processing chamber.

With continuing reference to FIG. 3, it can be seen that portions of the gas passage 20 extend through the seat 68 and through the shaft 18.

A nozzle 88, extending through a lower opening 89 of the lower cup 62, has a tip 90 which is located in the gas passage 20.

As shown in FIG. 2, the gas passage 20 extends all the way through an upper end 82 of the shaft 18. The upper end 82 of the shaft 18 extends partially through a hole 84 in the heat plate 38.

In use, the heat lamps 24, by infrared radiation, heat an upper face of the wafer 12 to a required processing temperature and the heat lamps 26, by infrared radiation, heat the heat plate 38. The heat plate 38, in turn, heats a lower face of the wafer 12 by radiation heat transfer and convection through the space 52. A pyrometer 86 detects a temperature on a lower surface of the heat plate 38.

Processing of the wafer 12 is accomplished by introducing a first processing gas flow into the chamber 14 through the inlet port 34. The first processing gas flows primarily over an upper face of the wafer 12. The first processing gas flow is in a direction that is substantially parallel to the upper face of the wafer 12. A portion of the first processing gas flow passes into the space 52 between the lower face of the wafer 12 and the upper surface of the heat plate 38.

As previously discussed, due to the limited dimensions of the space 52 the processing gas introduced into the space 52 tends to deplete before reaching a central portion on the lower surface of the wafer.

A second processing gas flow is introduced through the nozzle 88 extending through the lower cup 62 into the passage 20. The processing gas flows through the passage 20 into the chamber 14 and is directed into the space 52 and onto the lower face of the wafer 12 in a central area of the lower face of the wafer 12. The second gas flow exiting passage 20 is in a direction that is substantially parallel to the lower face of the wafer. The processing gas flowing through the passage 20 is utilized for primarily processing the wafer 12 in the central area of the lower face of the wafer 12. The processing gases introduced respectively through the inlet port 34 and through the nozzle 88 therefore jointly ensure that the lower face of the wafer 12 is more uniformly processed.

A primary advantage of the semiconductor processing system 10 as hereinbefore described is that a processing gas can be directed through the passage 20 onto a lower face of the wafer 12. The lower face of the wafer can so be processed. By forming the passage 20 through the shaft 18, a simple solution is provided to process the lower face of the wafer. In particular, the central portion of the lower face of the wafer 12 can be processed although a space 52, having limited dimensions is provided between the heat plate 38 and the wafer 12. Note, that it is important to minimize the distance between the heat plate 38 and the lower face of the wafer in order to maximize the heat transfer between the two surfaces. By processing the lower face of the wafer jointly with processing gases introduced through the inlet port 34 and through the passage 20, more uniform processing of the entire lower face of the wafer can be obtained. Moreover, the entire lower face of the wafer can be processed without doing away with the heat plate 38. The heat plate 38 can therefore be utilized for indirect heating of the wafer 12, and for providing a reference point on which the pyrometer 86 can detect a temperature.

When processing gas is directed through the passage 20 onto the lower face of the wafer 12, the wafer 12 may tend to become unseated from the seats 50. Referring to FIG. 2, the seats 50 are formed with inner seating portions 90 and outer portions 92. The outer portions 92 have relatively steep surfaces which restrict the wafer 12 from slipping off the seating surfaces 50.

The processing system 10 has application for forming, for example, amorphous silicon or polysilicon layers uniformly on opposing faces of a wafer, although the processing system 1 0 may, alternatively, be used for forming an epitaxial silicon layer on a wafer or for any other suitable purpose.

While certain exemplary embodiments have been described and shown in the accompanying drawings, it is to be understood that such embodiments are merely illustrative and not restrictive of the current invention, and that this invention is not restricted to the specific constructions and arrangements shown and described, since modifications may occur to those ordinarily skilled in the art.

What is claimed:

1. A semiconductor processing system comprising:
    a processing chamber having a processing gas inlet port and a processing gas outlet port;
    a wafer holder within the chamber;
    a heat plate located within the chamber at a spaced location from a wafer, when held by the holder, so that a processing gas flow space is defined between a face of the wafer and a surface of the heat plate;
    a heating device which heats the heat plate;
    a rotatable shaft, extending into the chamber, defining a processing gas flow passage into the chamber and directing flow into the processing gas flow space and onto a face of the wafer; and
    an actuator located externally of the processing chamber and being connected to one of the wafer holder and the heat plate so as to move the wafer holder and the heat plate relative to one another, thereby altering a width of the processing gas flow space.

2. The semiconductor processing system of claim 1 wherein the wafer holder is coupled to the shaft so that the shaft rotates the wafer holder.

3. The semiconductor processing system of claim 1 wherein the passage extends through the heat plate.

4. The semiconductor processing system of claim 1 wherein the actuator is connected to the wafer holder so as to move the wafer holder within the chamber relative to the heat plate.

5. The semiconductor of claim 4 wherein the shaft is movable in an axial direction thereof into and out of the chamber, the heat plate being connected to the shaft so as to move within the chamber relative to the wafer.

6. The semiconductor processing system of claim 1 wherein the shaft is movable in an axial direction thereof into and out of the chamber, the heat plate being connected to the shaft so as to move within the chamber relative to the wafer.

7. A method of processing a wafer, comprising:
    holding the wafer in a processing chamber with a processing gas flow space defined between a face of the wafer and a surface of a heat plate located in the chamber;
    actuating a device outside the processing chamber, thereby moving the heat plate relative to the wafer, thereby adjusting a width of processing gas flow space; and
    directing gas through a processing gas flow passage that discharges through the heat plate into the processing gas flow space and onto the face of the wafer.

* * * * *